United States Patent
Lu

(10) Patent No.: US 10,700,029 B2
(45) Date of Patent: Jun. 30, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/171,337

(22) Filed: Oct. 25, 2018

(65) Prior Publication Data

US 2020/0135675 A1 Apr. 30, 2020

(51) Int. Cl.
| | |
|---|---|
| H01L 23/00 | (2006.01) |
| H01L 23/532 | (2006.01) |
| H01L 21/768 | (2006.01) |
| H01L 21/48 | (2006.01) |
| H01L 23/13 | (2006.01) |

(52) U.S. Cl.
CPC .......... H01L 24/08 (2013.01); H01L 21/4853 (2013.01); H01L 21/76843 (2013.01); H01L 23/13 (2013.01); H01L 23/53238 (2013.01); H01L 24/03 (2013.01); H01L 24/13 (2013.01); H01L 2924/0105 (2013.01); H01L 2924/01022 (2013.01); H01L 2924/01029 (2013.01); H01L 2924/35121 (2013.01)

(58) Field of Classification Search
CPC ..... H01L 21/4814; H01L 21/71; H01L 24/07; H01L 24/15
See application file for complete search history.

(56) References Cited

U.S. PATENT DOCUMENTS 9,484,291 B1* 11/2016 Dhandapani ............ H01L 24/04
2014/0117553 A1* 5/2014 Ha Woo ............... H01L 21/4853
257/762

OTHER PUBLICATIONS

U.S. Appl. No. 15/673,235, filed Aug. 9, 2017, Lu, Wen-Long.

* cited by examiner

*Primary Examiner* — Cheung Lee
(74) *Attorney, Agent, or Firm* — Foley & Lardner LLP

(57) ABSTRACT

A semiconductor package device includes a first conductive structure, a second conductive structure and a dielectric layer. The first conductive structure has a tapered portion. The second conductive structure surrounds the tapered portion of the first conductive structure and is in direct contact with a side wall of the tapered portion of the first conductive structure. The dielectric layer surrounds the tapered portion of the first conductive structure and is in direct contact with the side wall of the tapered portion of the first conductive structure.

16 Claims, 15 Drawing Sheets

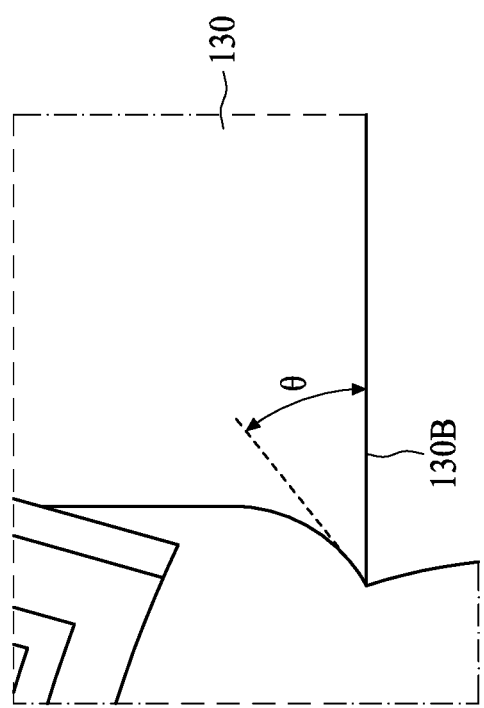

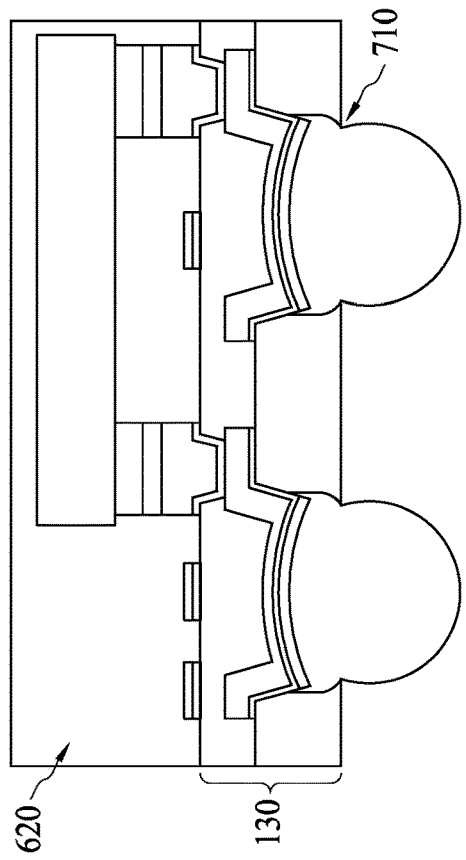
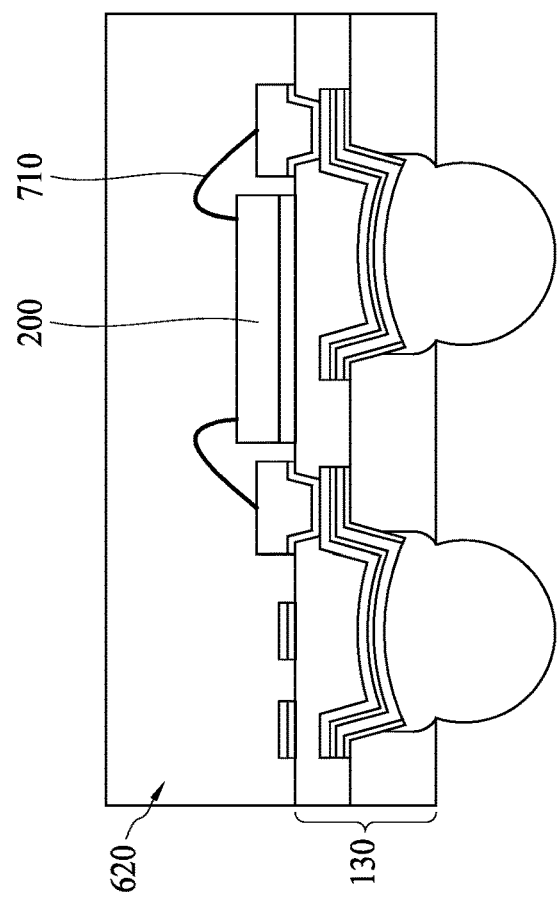
Figure 7A
Figure 7B

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including a soldering pad structure and a method of manufacturing the same.

2. Description of the Related Art

A semiconductor device package includes a semiconductor device electrically connected to a conductive pad (e.g. solder pad, bump pad, ball pad, etc.) on which a connection element (e.g. a solder ball, solder paste, etc.) is disposed for external connection. The semiconductor device may be electrically connected to the conductive pad through an interconnection structure (e.g. an RDL structure).

An under bump metallurgy (UBM) may be disposed between the conductive pad and the connection element to provide relatively strong bonding force. Nevertheless, delamination or crack damage may occur at or close to an interface (or boundary) between the above-mentioned structures during thermal cycles in manufacturing the semiconductor device package. Moreover, dielectric material (or passivation material) used to package the semiconductor device has relatively poor bonding to the conductive material (e.g. metal or alloy), which may also cause delamination or crack issues.

SUMMARY

In one or more embodiments, a semiconductor packaging device comprises a first conductive structure having a tapered portion; a second conductive structure surrounding the tapered portion of the first conductive structure and being in direct contact with a side wall of the tapered portion of the first conductive structure; and a dielectric layer surrounding the tapered portion of the first conductive structure and being in direct contact with the side wall of the tapered portion of the first conductive structure.

In one or more embodiments, a semiconductor packaging device comprises a first conductive structure having a first portion; a second conductive structure having a first portion engaged with the first portion of the first conductive structure; and a dielectric layer having a first portion engaged with the first portion of the second conductive structure.

In one or more embodiments, a method of forming the semiconductor packaging device comprises providing a metal plate; forming a dielectric layer on the metal plate, and patterning the dielectric layer to form one or more openings to expose a portion of the metal plate, the one or more openings having tapered sidewalls and arc-shaped corners at a bottom of the one or more openings; forming dome-shaped metal films at the bottom of the one or more openings; forming a first conductive structure extending from the bottom of the one or more openings to a top surface of the dielectric layer; removing the metal plate and the dome-shaped metal films to define a receiving space; and forming a second conductive structure at the receiving space.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 3 illustrates an enlarged view of a portion of the semiconductor package device of FIG. 2A in accordance with some embodiments of the present disclosure;

FIG. 7A illustrates a cross-sectional view of a semiconductor package device in accordance with some embodiments of the present disclosure;

FIG. 7B illustrates a cross-sectional view of a semiconductor package device in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
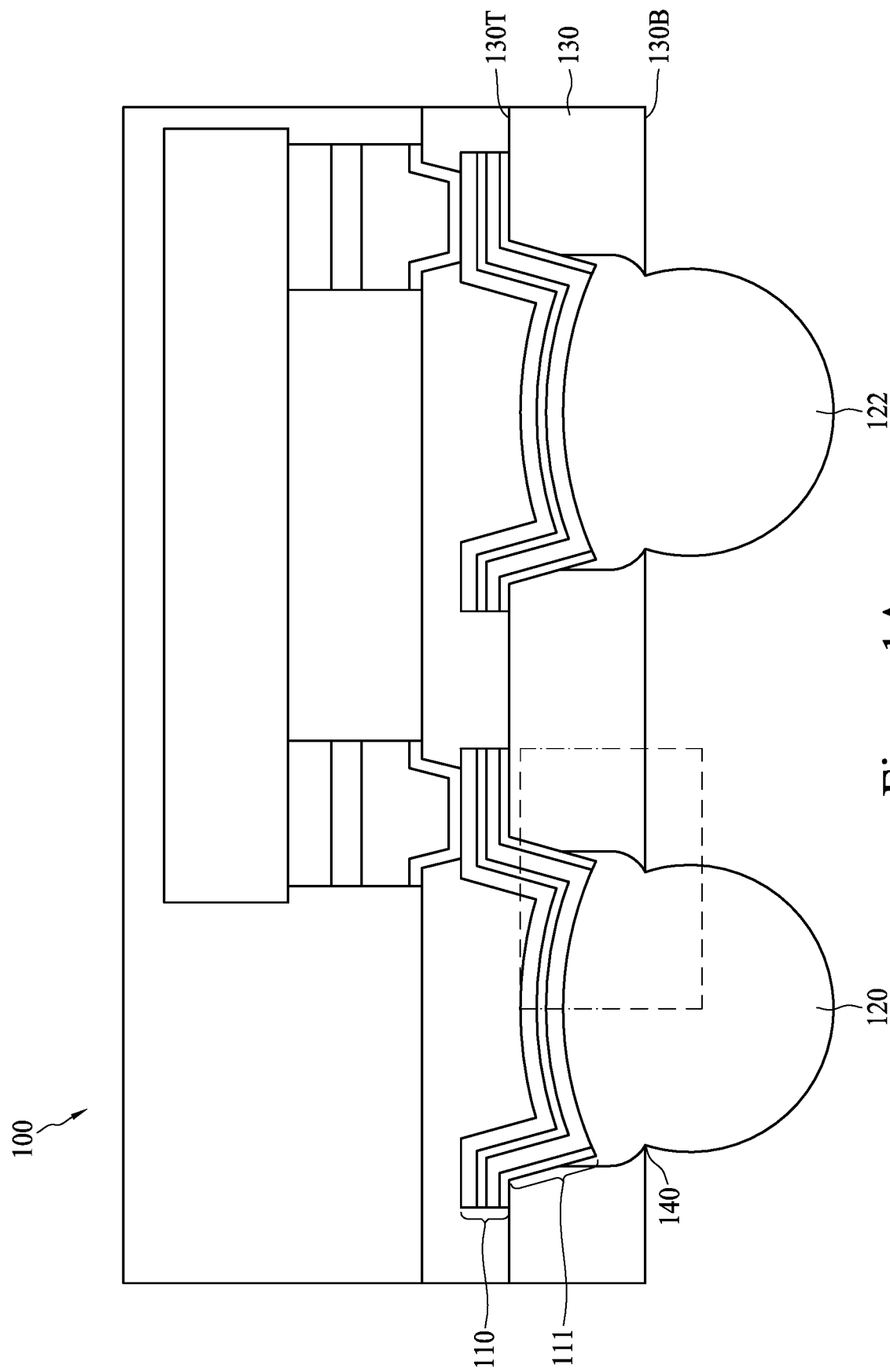
FIG. 1A illustrates a cross-sectional view of a semiconductor package device in accordance with some embodiments of the present disclosure.

FIG. 1A illustrates a cross-section view of a semiconductor package device 100 in accordance with some embodiments of the present disclosure. The semiconductor device comprises a conductive structure 110, a conductive structure 120 and a dielectric layer 130.

The conductive structure 110 has a portion 111 (also referred to as a tapered portion). The portion 111 of the conductive structure 110 tapers from a top surface 130T of the dielectric layer 130 toward the bottom surface 130B of the dielectric layer 130 so that the conductive structure 110 is wider at the top surface 130T of the dielectric layer 130 than the rest portion.

The dielectric layer 130 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 130 may include an inorganic material, such as silicon, a ceramic or the like.

Figure 1B:
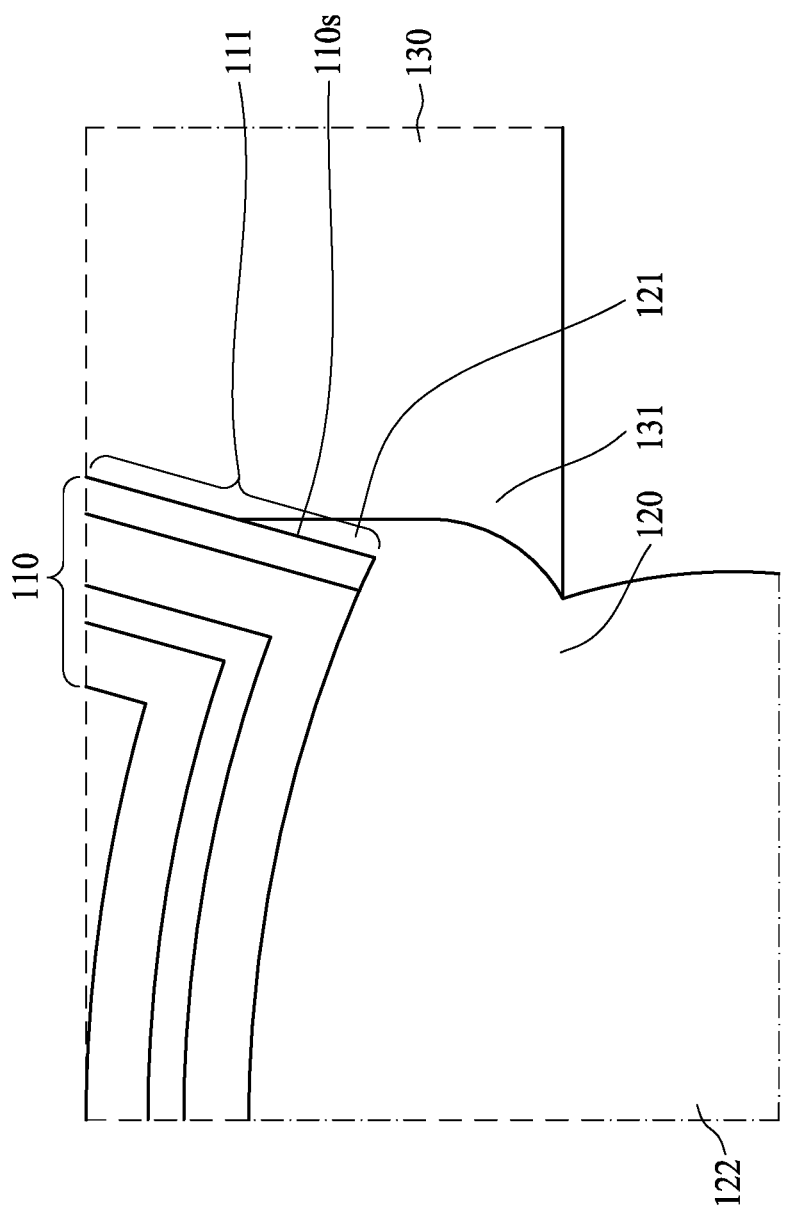
FIG. 1B illustrates an enlarged view of a portion of the semiconductor package device of FIG. 1A in accordance with some embodiments of the present disclosure.

FIG. 1B illustrate an enlarged view of a portion of the semiconductor device 100 of FIG. 1A. As shown in FIG. 1B, the conductive structure 120 surrounds the tapered portion 111 of the conductive structure 110, and directly contact with a side wall 110s. In some embodiments, the portion 111 of the conductive structure 110 engages with a portion 121 of the conductive structure 120.

Further, the dielectric layer 130 surrounds the tapered portion 111 of the conductive structure 110, and in direct contact with the side wall 110s of the tapered portion 111 of the conductive structure 110. In some embodiments, a portion of the dielectric layer 131 engages with the portion 121 of the conductive structure 120.

Figure 2A:
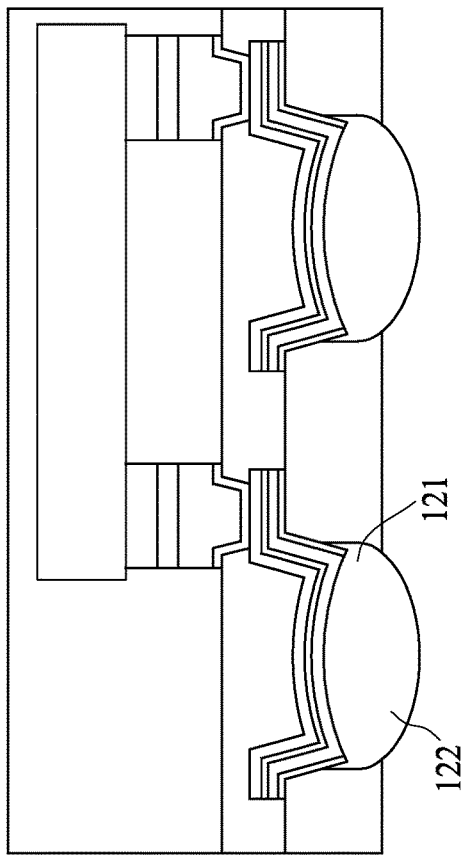
FIG. 2A illustrates a cross-sectional view of a semiconductor package device in accordance with some embodiments of the present disclosure.

The conductive structure 120 has a portion 121 and a portion 122. The portion 121 is surrounded by the dielectric layer 130, and the portion 122 protrudes from the portion 121 and beyond the surface 130B of the dielectric layer 130. In embodiment, the portion 121 of the conductive structure 120 and the portion 122 forms a neck 140, as shown in FIG. 2A. In some embodiment, the conductive structure 120 is a solder ball which can be securely clipped by the dielectric layer 130 with the neck. The solder ball has a diameter in a range of 150 μm-400 μm. In some embodiment, the conductive structure 120 is a controlled collapse chip connection (C4) bump, which have a diameter in a range of 50 μm-150 μm. In some embodiment, the conductive structure 120 is a land grid array (LGA). The material of the conductive structure 120 comprises tin (Sn).

In a comparative package structure, delamination, crack, damage may occur at or close to interface (or boundary) between dielectric and the conductive pad and/or between solder and conductive pad due to thermal, chemical and/or physical stress. The structure of the present disclosure which provides an engagement between the conductive structure 110 and the conductive structure 120 and that between the conductive structure 120 and the dielectric layer 130 can prevent delamination or crack occurring at the interfaces between above mentioned structures. Furthermore, the conductive structure 120 itself has good extensibility. The structure of the present disclosure can suffer a shear force more than 200 g.

Figure 2B:
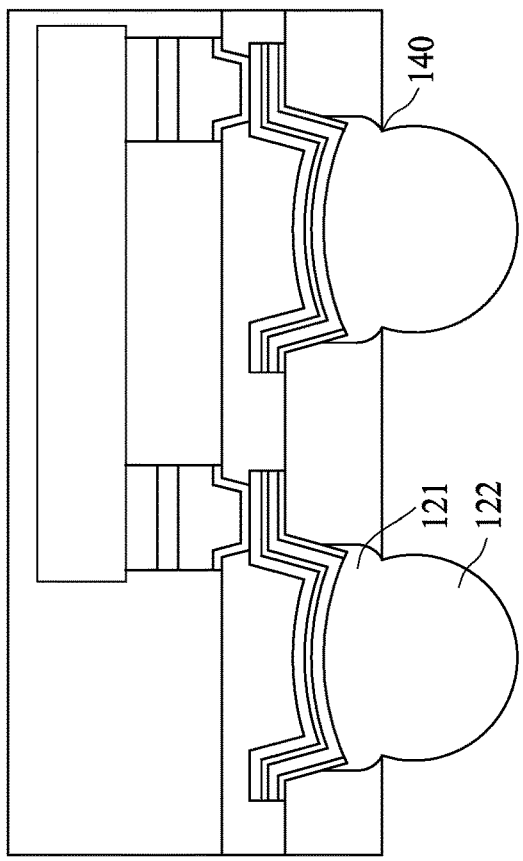
FIG. 2B illustrates a cross-sectional view of a semiconductor package device in accordance with some embodiments of the present disclosure.

In some embodiment, the portion 121 and the portion 122 do not form a noticeable neck, as shown in FIG. 2B. A smooth surface may be formed between the portion 121 and the portion 122. The structure may be applied in land grip array (LGA) which can reduce electrical contact area and to increase the numbers of contact points.

The structure of the present disclosure provides reducing opening for locating the conductive structure 120. The dimension of conductive structure 120 can be reduced, and density of the connection pads can be increase accordingly.

FIG. 3 shows a specific angle formed based on some embodiments of this disclosure. The surface 130B of the dielectric layer 130 and the conductive portion 121 of the conductive structure 120 define an angle θ, wherein the angle θ is less than 90°. In particular, the angle is in the range from 70° to 85°. In such structure, the dielectric layer 130 can securely grip the dielectric structure to prevent the dielectric structure from delamination or crack due to thermal, chemical and/or physical stress.

Figure 4:
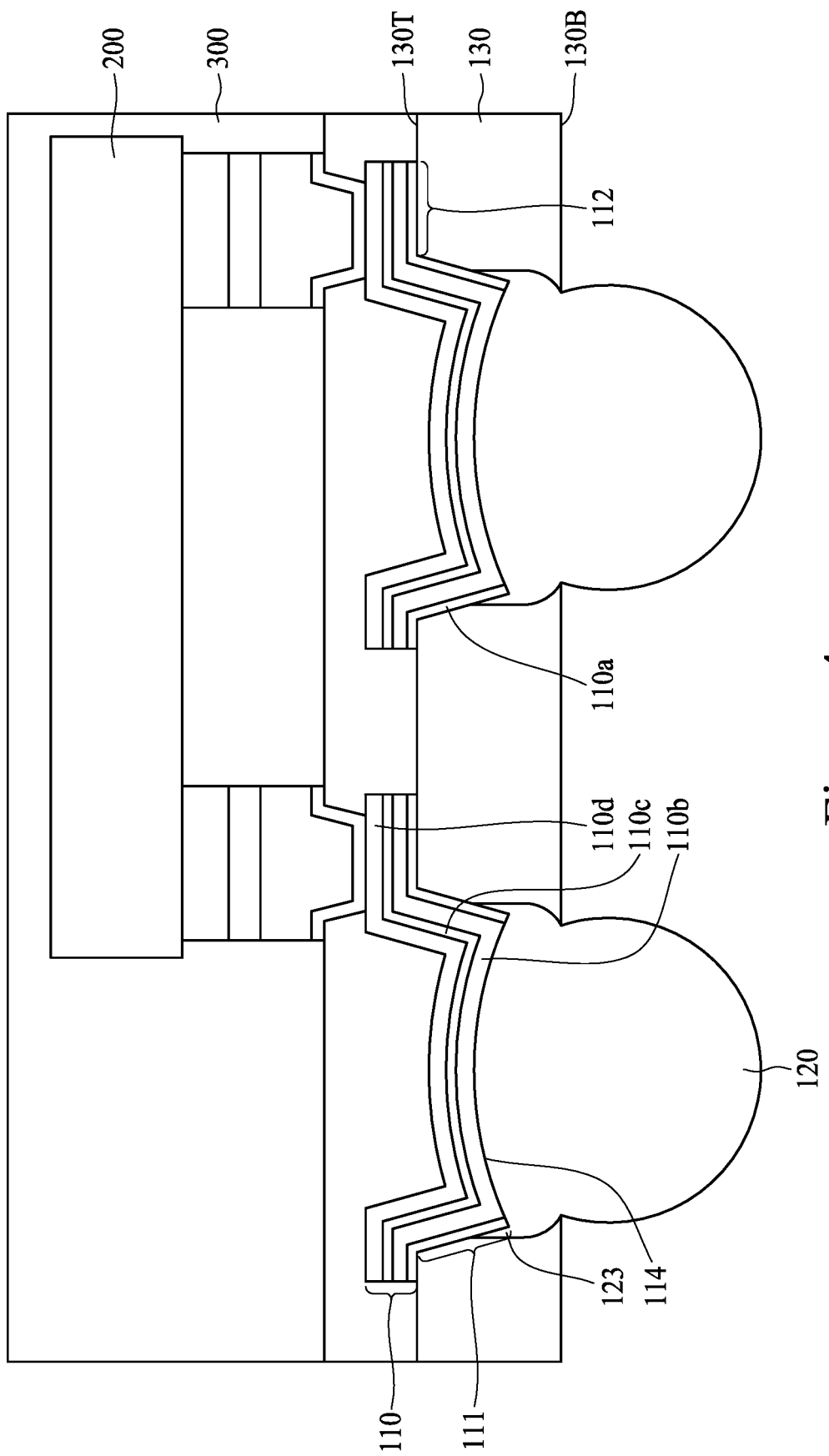
FIG. 4 illustrates a cross-sectional view of a semiconductor package device in accordance with some embodiments of the present disclosure.

FIG. 4 shows that the conductive structure 110 may be formed of a multilayer structure. The conductive structure 110 comprises a barrier layer 110a extended from the tapered portion 111 to a surface 130T of the dielectric layer 130 opposite to the surface 130B, and the barrier layer 110a contacts the dielectric layer 130. The barrier layer can increase the bonding strength between the dielectric layer 130 and the conductive structure 110. In some embodiments, the barrier layer includes titanium (Ti), Ni, palladium (Pd), other metal(s) or alloy(s), or a combination of two or more thereof. The thickness of a Ti barrier layer is in the range from 0.1 μm to 1.0 μm. The barrier layer is formed by physical vapor deposition (PVD), chemical vapor deposition (CVD), sputtering or other suitable processes.

Further, the conductive structure 110 comprises a copper (Cu) layer 110b, and the Cu layer defines a receiving surface 114 to contact with the conductive structure 120. In the structure, the Cu layer 110b in direct contacts and surrounds a portion of the conductive structure 120, and facilitates trapping the conductive structure 120. The Cu layer 110b also in direct contacts with the barrier layer 110a from tapered portion 111 of the conductive structure 110 to the extended portion 112 of the conductive structure 110 on the top surface of the dielectric layer 130. In some embodiment, the thickness of the Cu layer 110b is in the range from 0.2 μm to 3.0 μm. The Cu layer 110b is formed by physical vapor deposition (PVD), chemical vapor deposition (CVD), sputtering, electroplating or other suitable processes. The Cu layer 110b may be replaced with other suit metal, such as Au, Ag, Pt, Pd, other metal(s) or alloy(s), or a combination of two or more thereof.

In some embodiment, the conductive structure 110 further comprises a Ni layer 110c covering the Cu layer 110b. The thickness of the Ni layer 110c is in a range from 0.5 μm to 5.0 μm. The Ni layer may be replaced by other suit metal, such as Ti, W or its alloy. In some embodiment, a further Cu layer 110d covers the Ni layer 110c. The thickness of the further Cu layer 110d is in a range from 2.0 μm to 5.0 μm. Similar to the Cu layer 110b, the further Cu layer 110d may be replaced with other suit metal, such as Au, Ag, Pt, Pd, other metal(s) or alloy(s), or a combination of two or more thereof.

Further, a gap 123 is located between the barrier layer 110a and the dielectric layer 130, and the conductive structure 120 fills the gap. The filled gap enhances the engagement between the conductive structure 110 and the conductive structure 120.

The semiconductor packaging device further comprises a semiconductor chip 200 arranged above the surface 130T of the dielectric layer 130. The semiconductor chip 200 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, the number of the semiconductor chip 200 can be changed depending on different design specifications.

In some embodiment, a conductive pillar structure 300 is formed between the semiconductor 200 and the conductive structure 110. The conductive pillar structure 300 functions as a redistribution layer (RDL) to provide electrical connections. The semiconductor chip 200 electrically connects to an external connection and/or ground through the conductive pillar structure 300, the conductive structure 110 and the conductive structure 120. The conductive pillar structure 300 is formed of or includes gold (Au), silver (Ag), copper (Cu), platinum (Pt), Palladium (Pd), other metal(s) or alloy(s), or a combination of two or more thereof. In some embodiments, a thickness of the conductive pillar structure 300 is from about 1 μm to about 3 μm.

Figure 5A:
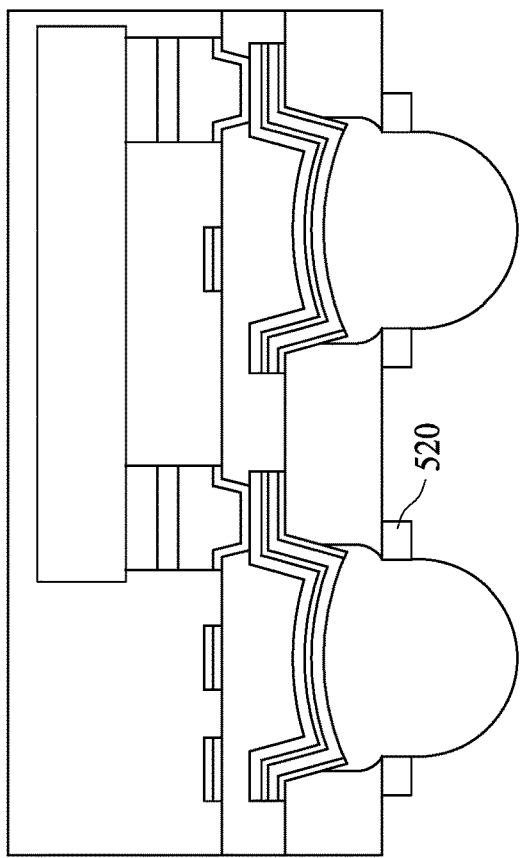
FIG. 5A illustrates a cross-sectional view of a semiconductor package device in accordance with some embodiments of the present disclosure.
Figure 5B:
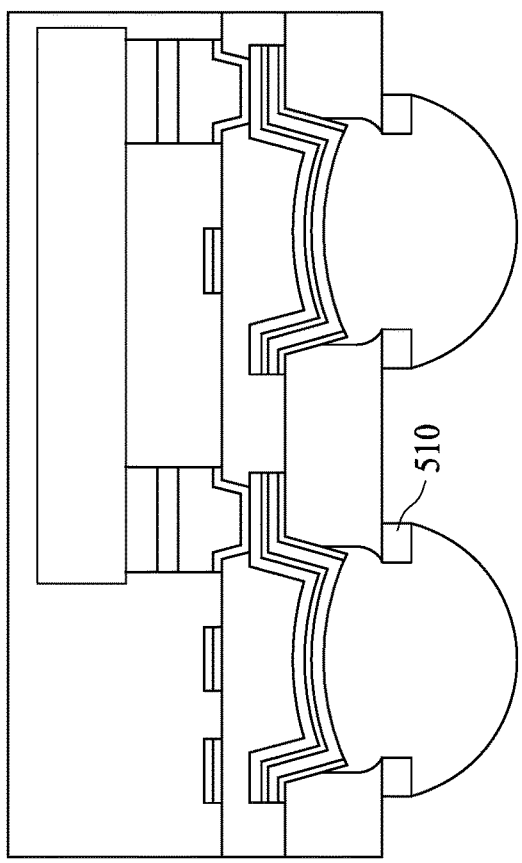
FIG. 5B illustrates a cross-sectional view of a semiconductor package device in accordance with some embodiments of the present disclosure.
Figure 5C:
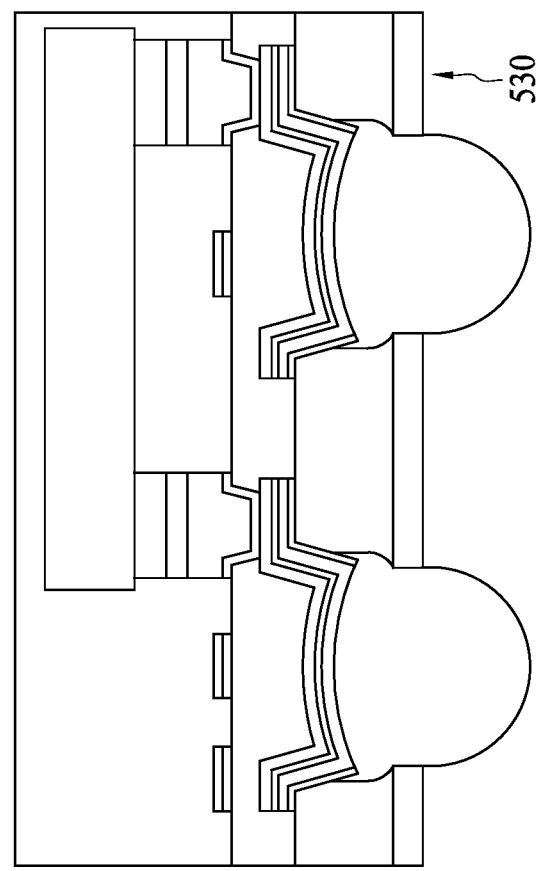
FIG. 5C illustrates a cross-sectional view of a semiconductor package device in accordance with some embodiments of the present disclosure.

FIGS. 5A and 5B shows further embodiments of the disclosure. A solder overhang structure 510 or a barrier overhang structure 520 surrounds the neck the conductive structure 120. Referring to FIG. 5C, in some embodiment, a solder mask 530 covers the dielectric layer. When forming soldering contacts on the dielectric layer, a bleeding may occur (e.g. during a reflow process), which would cause an undesired short (e.g., bridge) between two conductive pads. The solder overhang structure 510, the barrier overhang structure 520, and the solder mask 530 can be used to avoid the bridge issue, and prevent the neck of the conductive structure 120 from cracking due to stress applied on the neck. Further, the solder mask 530 can protect the dielectric layer from humidity. The solder overhang structure 510 and the barrier overhang structure 520 are formed of conductive material. The solder mask 530 is formed of dielectric material.

Figure 6A:
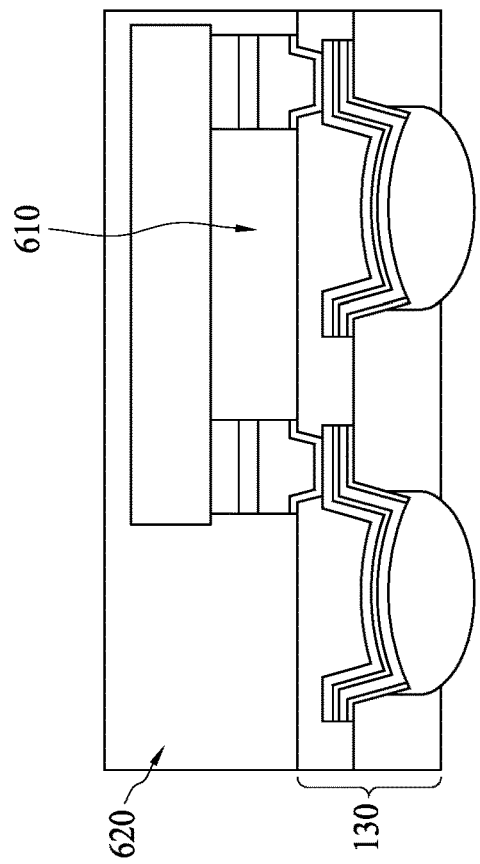
FIG. 6A illustrates a cross-sectional view of a semiconductor package device in accordance with some embodiments of the present disclosure.
Figure 6B:
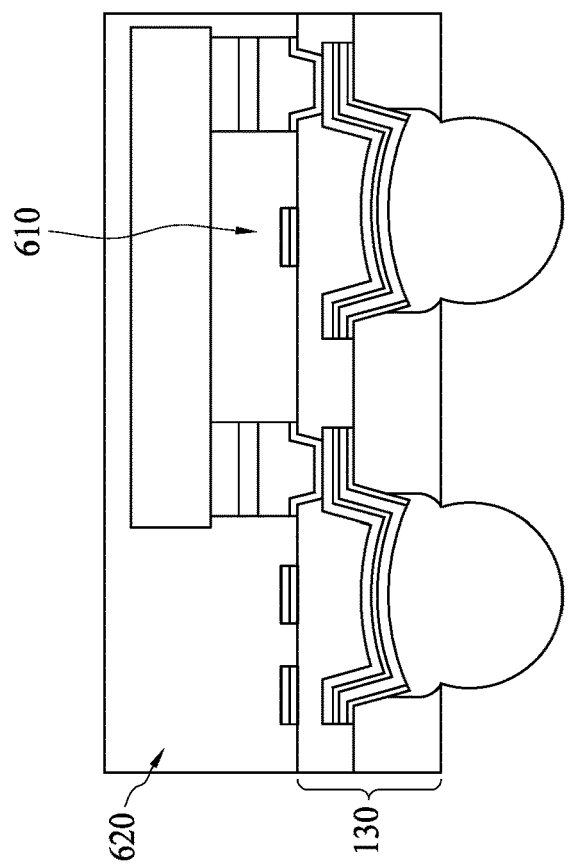
FIG. 6B illustrates a cross-sectional view of a semiconductor package device in accordance with some embodiments of the present disclosure.
Figure 6C:
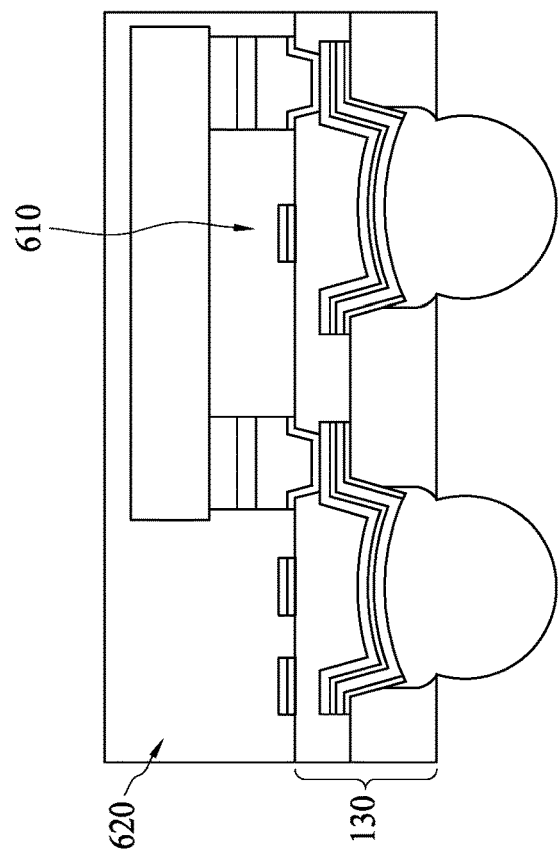
FIG. 6C illustrates a cross-sectional view of a semiconductor package device in accordance with some embodiments of the present disclosure.

Referring to FIGS. 6A-6C, in some embodiments, the dielectric layer 130 is a multiplayer structure, and the number of dielectric layers can vary according to several different embodiments. In some embodiments, the dielectric layer 130 may include organic material, solder mask, polyimide (PI), epoxy, Ajinomoto build-up film (ABF), molding compound, or a combination of two or more thereof.

Figure 6D:
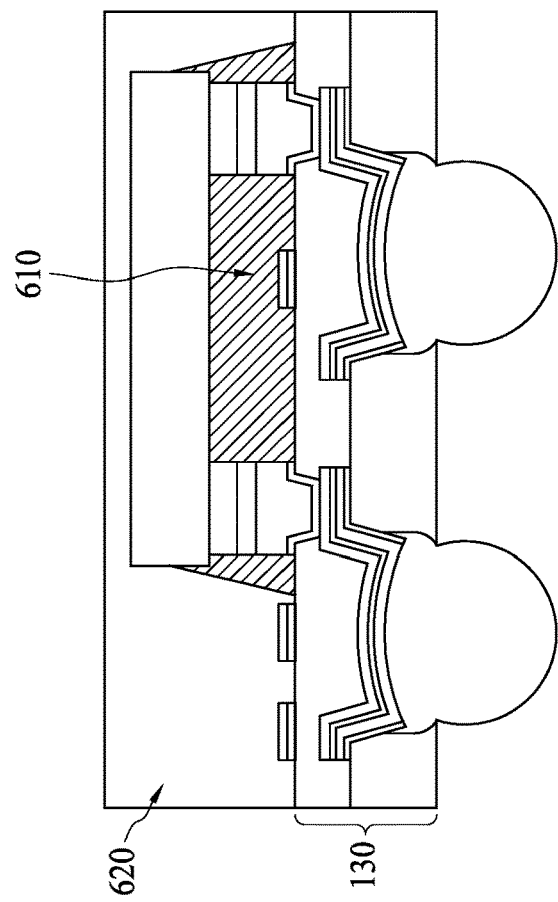
FIG. 6D illustrates a cross-sectional view of a semiconductor package device in accordance with some embodiments of the present disclosure.

In some embodiment, an underfill 610 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 610 may be a capillary underfill (CUF) (as shown in FIG. 6C), a molded underfill (MUF) (as shown in FIGS. 6A and 6B) or a dispensing gel (NCF or NCP, etc.), depending on specifications of different embodiments. In some embodiments, the underfill 610 can be omitted (see FIG. 6D).

The package body 620 disposed on the dielectric layer 130 and covers the semiconductor chip 200 and the underfill 610. In some embodiments, the package body 620 covers a back surface (also referred to as backside) of the semiconductor chip 200. Alternatively, the package body 620 exposes the back surface of the semiconductor chip 200. In some embodiments, the package body 620 includes, for example, one or more organic materials (e.g., molding compound, bismaleimide triazine (BT), PI, polybenzoxazole (PBO), solder resist, ABF, polypropylene (PP), epoxy-based material, or a combination of two or more thereof), inorganic materials (e.g., silicon, glass, ceramic, quartz, or a combination of two or more thereof), liquid, dry-film material(s), or a combination of two or more thereof.

Referring to FIG. 4, in some embodiment, the active surface of the semiconductor chip 200 faces toward to the dielectric layer 130. The semiconductor chip 200 is bonded to the conductive pillar structure 300 in direct or via a solder/micro-bump. Alternatively, referring to FIG. 7A, the back surface (also referred to as backside) of the semiconductor chip 200 faces toward to the dielectric layer 130, and the contact pads of the semiconductor chip 200 electrically connect to the conductive pillar structure via bonding wires 710.

Referring to FIG. 7B, in some embodiment, a curved pad is formed on the receiving surface of the conductive structure, and a solder ball is formed on the curved pad.

FIGS. 8A-8H are cross-sectional views of a semiconductor structure fabricated at various stages, in accordance with some embodiments of the present disclosure. Various figures have been simplified for a better understanding of the aspects of the present disclosure.

Figure 8A:
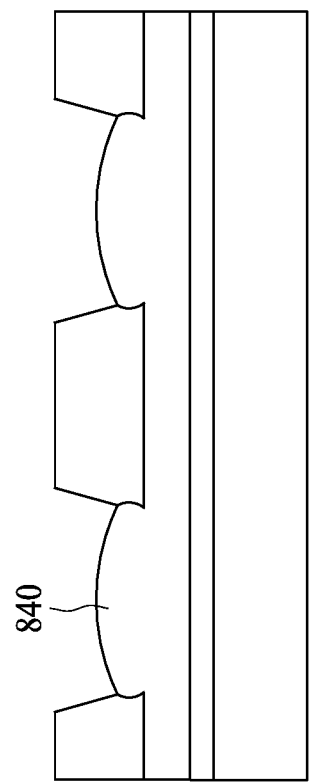
FIG. 8A illustrates one or more stages of a method of manufacturing a semiconductor package device in accordance with some embodiments of the present disclosure.

Referring to FIG. 8A, a metal plate 810 is provided. In some embodiments, the metal plate 810 is formed of, e.g., Cu or other metals or alloys. In some embodiments, a thickness of the metal plate 39 is about 100 μm to 200 μm, about 50 μm to about 400 μm, or about 10 μm to about 1000 μm. In some embodiment, the metal plate comprises a Cu layer with a Ti layer formed on a carrier.

A dielectric layer 820 is formed a top surface 810t of the metal plate 810. One or more openings 830 are formed in the dielectric layer 820 by lithography and suit deposition process to expose a part of the top surface 810t of the metal plate 810. During lithographic process, persons utilize known defocus techniques, such as selecting the material of the photoresist film, the thickness of the photoresist film, wavelength length of the exposure beam, and/or exposure time, etc., so as to form the openings 830 having tapered sidewalls and arc-shaped corners at the bottom of the openings 830.

Figure 8B:
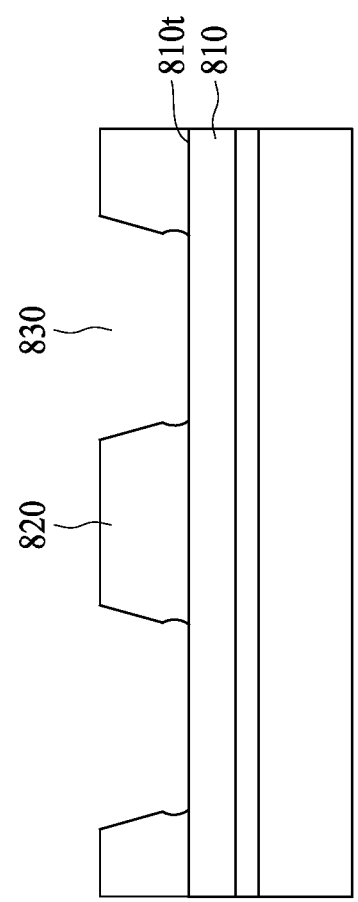
FIG. 8B illustrates one or more stages of a method of manufacturing a semiconductor package device in accordance with some embodiments of the present disclosure.

Referring to FIG. 8B, a metal layer 840 is formed on the exposed portion of the top surface 810t of the metal plate 810. Well-controlled chemical composition of the plating solution, inhibitor and/or growth agent can facilitate the metal layer 840 being formed as domed-shaped within the openings 830.

In the following process, a conductive structure 850 is formed. A barrier layer 850a is formed to cover the exposed domed-shaped metal layer 840 and the patterned dielectric layer 820. The barrier layer 850a is also a seed layer to facilitate the sequent formation of metal layers. The barrier layer 850a can be formed by, e.g., sputtering metal (e.g., Ti or Cu).

Figures 8C, 8D:
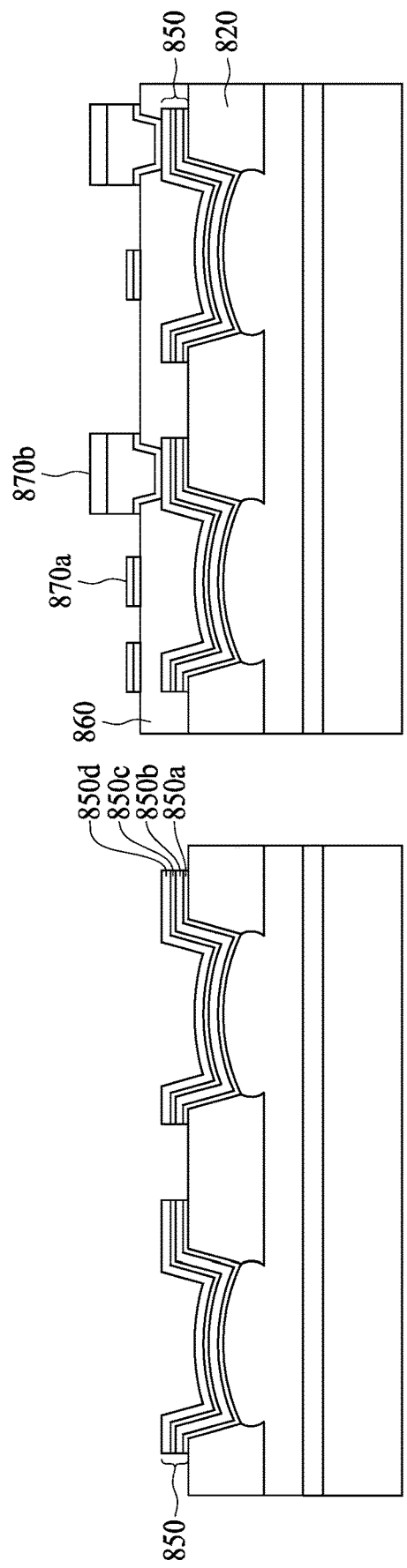
FIG. 8C illustrates one or more stages of a method of manufacturing a semiconductor package device in accordance with some embodiments of the present disclosure.
FIG. 8D illustrates one or more stages of a method of manufacturing a semiconductor package device in accordance with some embodiments of the present disclosure.

A Cu layer 850b is formed on the barrier layer 850a. In some embodiment, a Ni layer 850c and/or a further copper layer 850d are formed on the copper layer 850b. The barrier layer 850a, the copper layer 850b, Ni layer 850c and further copper layer 850d are patterned to form one or more holes to expose part of the dielectric layer 820, as shown in FIG. 8C. The conductive structure 850 extends within the openings 830 and a part of the photoresist film 820.

Referring to FIG. 8D, a further dielectric layer 860 is formed to cover the conductive structure 850 and the exposed dielectric layer 820, and the further dielectric layer 860 is patterned to expose the extension portion of the conductive structure 850 on the dielectric layer 820. The material of the further dielectric layer 860 and that of the dielectric layer 820 may be the same.

A seed layer and a pillar conductive structure 870a, 870b are formed on the conductive structure 850 and/or the further dielectric layer 860. The pillar conductive structure 870a may comprise a copper layer. The pillar conductive structure 870b functions as a redistribution layer (RDL). The structure of the pillar conductive structure 870a, 870b has various embodiments depends on specified electrical connection. The additional conductive structure 870a, 870b comprise a metal layer, such as Cu, Ni, W or alloy thereof and can be formed by, e.g., electroplating, electroless plating, sputtering, paste printing, bumping or bonding process.

Figure 8E:
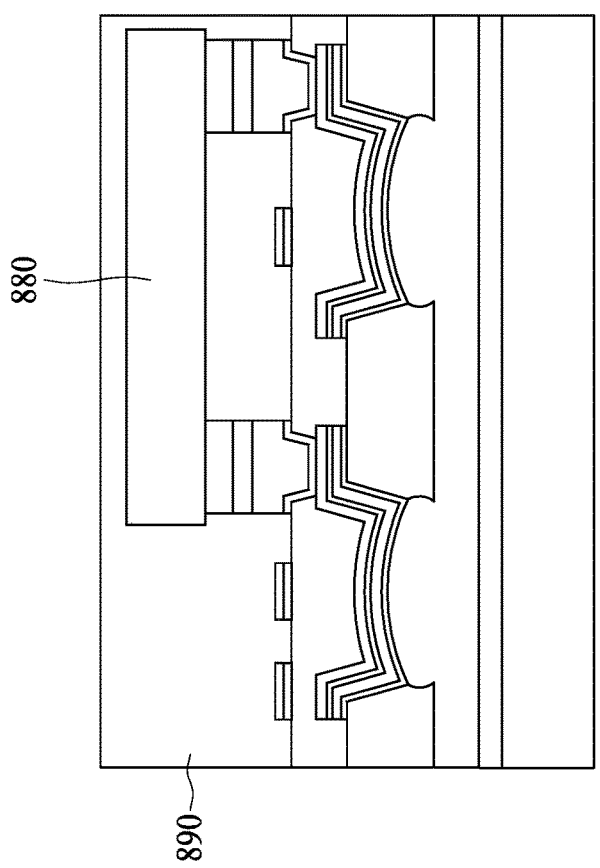
FIG. 8E illustrates one or more stages of a method of manufacturing a semiconductor package device in accordance with some embodiments of the present disclosure.

Referring to FIG. 8E, a semiconductor chip 880 is bonded to the conductive structure 870b with a solder or microbump. The semiconductor chip 880 may be chips, dies, and/or similar. The semiconductor chip 880 and the dielectric layer 860 are packaged with package body 890. In some embodiment, the space between the semiconductor chip 880 and the dielectric layer 860 is filled with underfill.

Figure 8F:
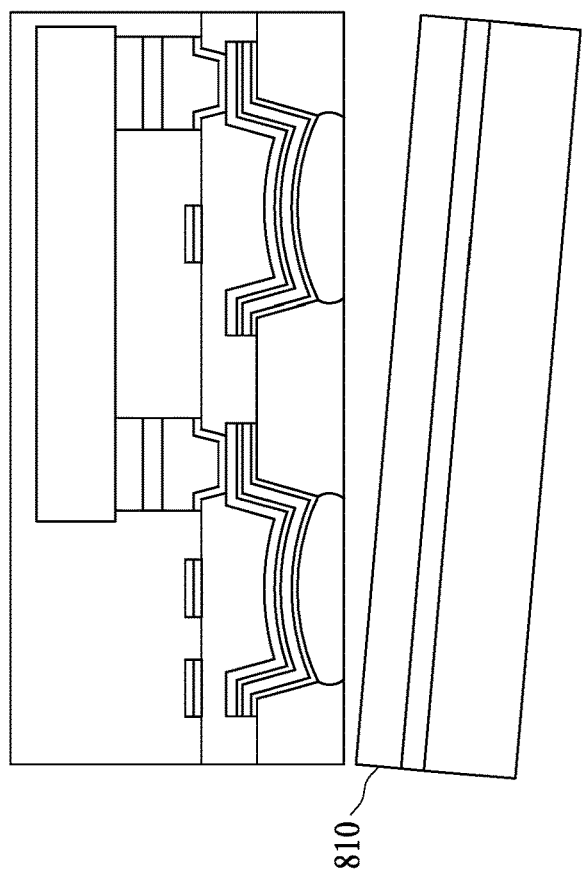
FIG. 8F illustrates one or more stages of a method of manufacturing a semiconductor package device in accordance with some embodiments of the present disclosure.

Referring to FIG. 8F, the metal plate is removed by, e.g., etching, plasma, peeling or shearing. Referring to 8G, chemical etching process removes the metal layer 840. In some embodiment, the part of the barrier layer contacting with the metal layer 840 are also removed by etching process. Therefore, the metal layer at the bottom of the conductive structure 850 is exposed. As a result, the metal layer 840 and the photoresist film 820 form a receiving space. A gap is formed between the barrier layer 850a and the dielectric layer 820.

Figure 8H:
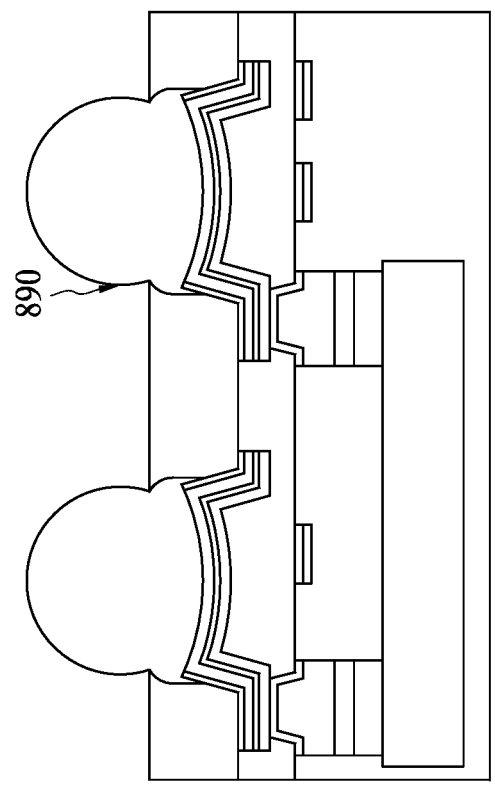
FIG. 8H illustrates one or more stages of a method of manufacturing a semiconductor package device in accordance with some embodiments of the present disclosure.
Figure 8G:
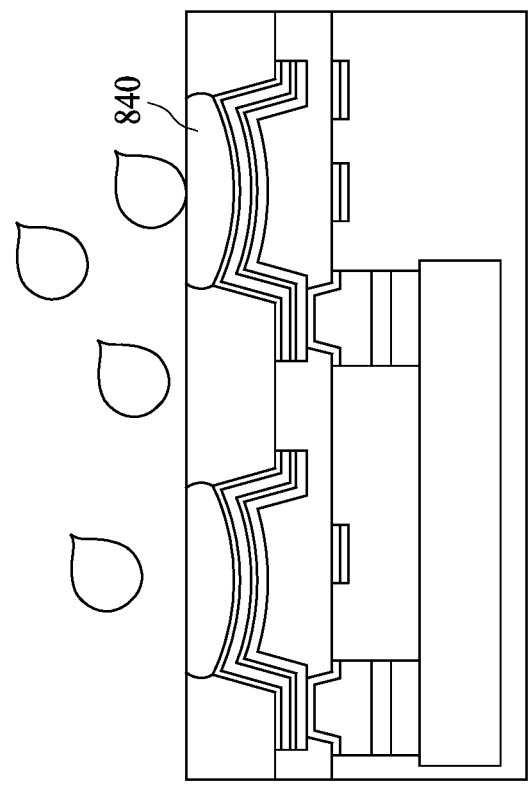
FIG. 8G illustrates one or more stages of a method of manufacturing a semiconductor package device in accordance with some embodiments of the present disclosure.

Referring to FIG. 8H, a conductive structure 890 is formed at the receiving space. The conductive structure 890 is a Controlled Collapse Chip Connection (C4) bump, a Ball Grid Array (BGA) or a Land Grid Array (LGA). In some embodiments, the conductive structure 890 can be formed by, e.g., electroplating, electroless plating, sputtering, paste printing, bumping or bonding process. The conductive structure 890 fills in the gap formed between the barrier layer 850a and the dielectric layer 820. In some embodiments, the semiconductor package device shown in FIG. 8H is substantially the same as or similar to the semiconductor package device 100 shown in FIG. 1A.

Figure 9B:
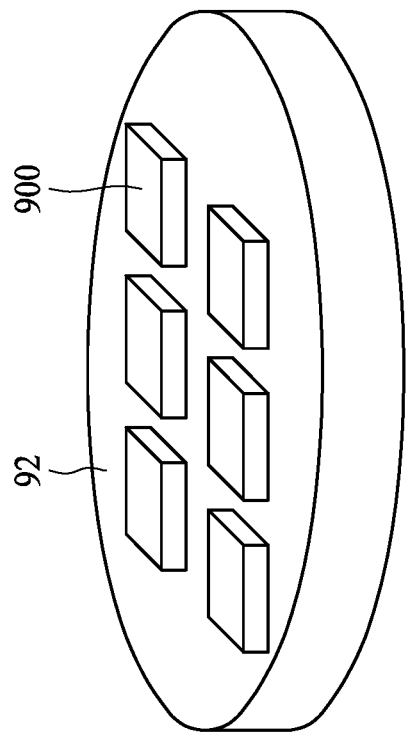
FIG. 9B illustrates various types of semiconductor package devices in accordance with some embodiments of the present disclosure.
Figure 9A:
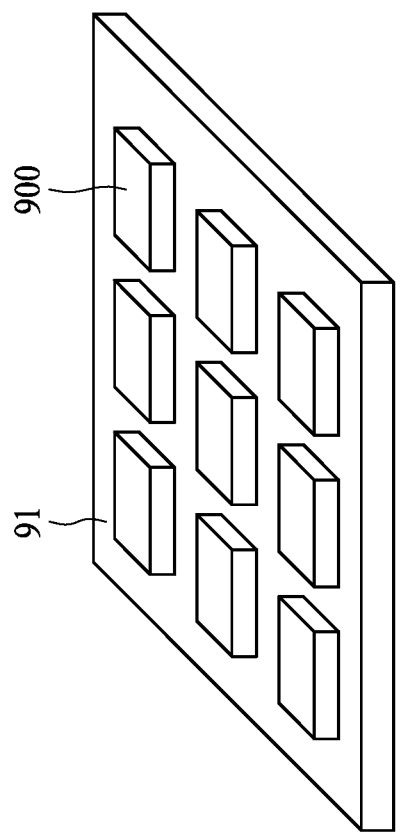
FIG. 9A illustrates various types of semiconductor package devices in accordance with some embodiments of the present disclosure.

FIGS. 9A and 9B illustrate different types of semiconductor package devices in accordance with some embodiments of the present disclosure.

As shown in FIG. 9A, a plurality of chips 900 and/or dies are placed on a square-shaped carrier 91. In some embodiments, the carrier 91 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As shown in FIG. 9B, a plurality of chips 900 and/or dies are placed on a circle-shaped carrier 92. In some embodiments, the carrier 92 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor packaging device, comprising:
a first conductive structure having a tapered portion;
a second conductive structure surrounding the tapered portion of the first conductive structure and being in direct contact with a side wall of the tapered portion of the first conductive structure; and
a dielectric layer surrounding the tapered portion of the first conductive structure and being in direct contact with the side wall of the tapered portion of the first conductive structure,
wherein the second conductive structure comprises a first conductive portion and a second conductive portion, the first conductive portion being surrounded by the dielectric layer and the second conductive portion protruding from the first conductive portion and beyond a first surface of the dielectric layer, and
wherein the first conductive structure comprises a barrier layer extended from the tapered portion to a second surface of the dielectric layer opposite to the first surface of the dielectric layer, and the barrier layer contacts the dielectric layer.

2. The semiconductor packaging device of claim 1, wherein the first conductive portion of the second conductive structure and the second conductive portion of the second conductive structure forms a neck.

3. The semiconductor packaging device of claim 1, wherein a first surface of the dielectric layer and the first conductive portion of the second conductive structure define an angle θ, and the angle θ is in the range from 70° to 85°.

4. The semiconductor packaging device of claim 1, wherein a gap is located between the barrier layer and the dielectric layer, and the second conductive structure fills the gap.

5. The semiconductor packaging device of claim 1, wherein the barrier layer comprises a Ti layer.

6. The semiconductor packaging device of claim 1, wherein the first conductive structure comprises a Cu layer, the Cu layer defining a receiving surface to contact with the second conductive structure.

7. The semiconductor packaging device of claim 1, wherein a material of the second conductive structure comprises Sn.

8. The semiconductor packaging device of claim 1, further comprising a semiconductor chip arranged above a first surface of the dielectric layer and electrically connected to the first conductive structure.

9. A semiconductor packaging device, comprising:
a first conductive structure having a first portion;
a second conductive structure having a first portion engaged with the first portion of the first conductive structure; and
a dielectric layer having a first portion engaged with the first portion of the second conductive structure,
wherein the second conductive structure comprises a second portion protruding from the first portion of the second conductive structure and beyond a first surface of the dielectric layer, and wherein the first portion of the second conductive structure and the second portion of the second conductive structure form a neck, and
wherein the first conductive structure comprises a barrier layer extended from the first portion to a second surface of the dielectric layer opposite to the first surface of the dielectric layer, and the barrier layer contacts the dielectric layer,
wherein the second conductive structure comprises a second portion protruding from the first portion of the second conductive structure and beyond a first surface of the dielectric layer, and wherein the first portion of the second conductive structure and the second portion of the second conductive structure form a neck, and
wherein the first conductive structure comprises a barrier layer extended from the first portion to a second surface of the dielectric layer opposite to the first surface of the dielectric layer, and the barrier layer contacts the dielectric layer.

10. The semiconductor packaging device of claim 9, wherein the first conductive structure comprises a Cu layer, the Cu layer defining a receiving surface to contact with the second conductive structure, and wherein the Cu layer contacts with the barrier layer.

11. The semiconductor packaging device of claim 9, wherein a gap is located between the barrier layer and the dielectric layer, and the second conductive structure fills the gap.

12. The semiconductor packaging device of claim 9, further comprising a barrier overhang surrounding the neck.

13. The semiconductor packaging device of claim 9, further comprising a soldering overhang surrounding the neck.

14. The semiconductor packaging device of claim 9, wherein a first surface of the dielectric layer and the first portion of the second conductive structure define an angle θ, and the angle θ is in the range from 70° to 85°.

15. The semiconductor packaging device of claim 9, wherein the first conductive structure has a tapered portion.

16. A method of forming the semiconductor packaging device, comprising:
providing a metal plate;
forming a dielectric layer on the metal plate, and patterning the dielectric layer to form one or more openings to expose a portion of the metal plate, the one or more openings having tapered sidewalls and arc-shaped corners at a bottom of the one or more openings;

forming dome-shaped metal films at the bottom of the one or more openings;

forming a first conductive structure extending from the bottom of the one or more openings to a top surface of the dielectric layer;

removing the metal plate and the dome-shaped metal films to define a receiving space; and forming a second conductive structure at the receiving space.

* * * * *